US012628648B2

(12) United States Patent
Liu et al.

(10) Patent No.: US 12,628,648 B2
(45) Date of Patent: May 12, 2026

(54) SEMICONDUCTOR CHIP HAVING A HIGH THERMAL LIQUID COOLANT

(71) Applicant: Sandisk Technologies, Inc., Milpitas, CA (US)

(72) Inventors: Yangming Liu, Shanghai (CN); Bo Yang, Dublin, CA (US); Ning Ye, San Jose, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 372 days.

(21) Appl. No.: 18/357,341

(22) Filed: Jul. 24, 2023

(65) Prior Publication Data

US 2024/0304518 A1     Sep. 12, 2024

Related U.S. Application Data

(60) Provisional application No. 63/488,555, filed on Mar. 6, 2023.

(51) Int. Cl.
| | |
|---|---|
| *H01L 23/473* | (2006.01) |
| *H01L 23/04* | (2006.01) |
| *H01L 23/42* | (2006.01) |
| *H10W 40/47* | (2026.01) |
| *H10W 40/70* | (2026.01) |
| *H10W 76/12* | (2026.01) |
| *H10W 74/15* | (2026.01) |
| *H10W 90/00* | (2026.01) |

(52) U.S. Cl.
CPC ........... *H10W 40/47* (2026.01); *H10W 40/70* (2026.01); *H10W 76/12* (2026.01); *H10W 74/15* (2026.01); *H10W 90/724* (2026.01); *H10W 90/734* (2026.01)

(58) Field of Classification Search
CPC ....... H01L 23/473; H01L 23/04; H01L 23/42; H01L 24/16; H01L 24/32; H01L 24/73; H01L 2224/16225; H01L 2224/32225; H01L 2224/73204; H10W 40/47; H10W 40/70; H10W 76/12; H10W 74/15; H10W 90/724; H10W 90/734
See application file for complete search history.

(56) References Cited

U.S. PATENT DOCUMENTS

| | | | | |
|---|---|---|---|---|
| 11,348,857 | B2 | 5/2022 | Qu | |
| 2013/0021752 | A1* | 1/2013 | Campbell | ............. H01L 23/473 165/138 |
| 2019/0393118 | A1* | 12/2019 | Rawlings | ................ H01L 24/29 |
| 2020/0203254 | A1* | 6/2020 | Dhane | ................... H01L 23/473 |
| 2021/0407886 | A1* | 12/2021 | Cheng | ................... H01L 23/473 |
| 2023/0417619 | A1* | 12/2023 | Cheung | ................... G01M 3/16 |

* cited by examiner

*Primary Examiner* — Peniel M Gumedzoe
(74) *Attorney, Agent, or Firm* — DENTONS Durham Jones Pinegar

(57) ABSTRACT

A semiconductor package includes a flip chip die communicatively coupled to a substrate. A lid is also coupled to the substrate and covers the flip chip die. A non-curing thermal conductive liquid coolant fills a volume defined by the lid and is used to dissipate heat that is generated by the flip chip die. The non-curing thermal conductive liquid coolant may include nanometer-sized particles that enhance the heat dissipation properties of the non-curing thermal conductive liquid coolant. The semiconductor package also may include a micro-rotator that causes the non-curing thermal conductive liquid coolant to circulate within the volume when a temperature of the flip chip die exceeds a temperature threshold.

20 Claims, 5 Drawing Sheets

400
410  420    430    440

450

500

510

RECEIVE/MONITOR TEMPERATURE READING ASSOCIATED WITH SEMICONDUCTOR CHIP

520

NO

TEMPERATURE READING ABOVE THRESHOLD?

YES

530

ACTIVATE MICRO-ROTATOR

540

MONITOR TEMPERATURE OF SEMICONDUCTOR CHIP

550

YES

TEMPERATURE READING ABOVE THRESHOLD?

NO

560

DEACTIVATE MICRO-ROTATOR

600

610

PREPARE SUBSTRATE

620

COUPLE FLIP CHIP DIE TO SUBSTRATE

630

SECURE LID OVER FLIP CHIP DIE AND ADHERE TO SUBSTRATE

640

DISPENSE THERMAL CONDUCTIVE LIQUID COOLANT IN VOLUME DEFINED BY LID

650

SEAL APERTURE DEFINED BY LID

SEMICONDUCTOR CHIP HAVING A HIGH THERMAL LIQUID COOLANT

CROSS-REFERENCE TO RELATED APPLICATIONS

The present application claims priority to U.S. Provisional Application 63/488,555 entitled "SEMICONDUCTOR CHIP HAVING A HIGH THERMAL LIQUID COOL-ANT", filed Mar. 6, 2023, the entire disclosure of which is hereby incorporated by reference in its entirety.

BACKGROUND

An increasing number of electronic devices use various semiconductor chips to process and store data. As demand for semiconductor chips increases, so do the demands for higher density, smaller size and higher performance. In order to meet these demands, semiconductor chips, and their associated packages, have become smaller and thinner. Additionally, semiconductor chips use higher power and/or higher performance components. These components typically consume more power and, as a result, generate more heat. If the heat is not efficiently dissipated from the semiconductor chips, the performance and/or the reliability of the semiconductor chips may be negatively impacted.

Accordingly, it would be beneficial for semiconductor chips to have thermal dissipation features that effectively and efficiently dissipate heat without increasing size of the semiconductor chips or sacrificing the performance of the semiconductor chips.

SUMMARY

The present application describes a semiconductor package or semiconductor chip that has various thermal dissipation features. In an example, the semiconductor package is a high-performance flip chip ball grid array (FC-BGA) structure that includes, among other features, a flip chip die electrically coupled to a substrate. A lid may be coupled to the substrate and encloses the flip chip die. In order to displace any air that may be trapped between the lid and the substrate, and in order to effectively and efficiently dissipate heat, the semiconductor package includes a non-curing thermal conductive liquid coolant. The non-curing thermal conductive liquid coolant fills a volume defined by the lid. The non-curing thermal conductive liquid coolant may include nanometer-sized particles that enhance the heat dissipation properties of the non-curing thermal conductive liquid coolant. The semiconductor package may also include a micro-rotator that causes the non-curing thermal conductive liquid coolant to circulate or move within the volume and/or around the flip chip die when a temperature of the flip chip die (or the semiconductor package) exceeds a temperature threshold.

Accordingly, the present application describes a semiconductor chip that includes a substrate and an integrated circuit. The integrated circuit is electrically coupled to a surface of the substrate. A lid encloses the integrated circuit and is also coupled to the substrate. The lid defines a volume between the substrate and the lid. A non-curing thermal conductive liquid coolant substantially fills the volume. The lid also defines at least one aperture that enables the non-curing thermal conductive liquid coolant to be dispensed within the volume. A stopper is used to seal the aperture.

The present application also describes a semiconductor chip that includes a substrate and an integrated circuit means. The integrated circuit means is electrically coupled to a surface of the substrate. An enclosure means is coupled to the substrate and substantially encloses the integrated circuit means. The enclosure means also defines a space between the substrate and a bottom surface of the enclosure means. A non-curing liquid coolant means at least substantially fills the space defined by the enclosure means. The non-curing liquid coolant means may also include a plurality of nanoparticles.

Also described is a semiconductor chip that includes a high-density interconnection substrate and an integrated circuit. The integrated circuit is electrically coupled to a surface of the high-density interconnection substrate. A micro-rotator is also electrically coupled to the high-density interconnection substrate. The semiconductor chip also includes a lid that is coupled to the substrate and encloses the integrated circuit and the micro-rotator. The lid also defines a volume. A non-curing thermal conductive liquid coolant at least substantially fills the volume and is adapted to flow within the volume upon activation of the micro-rotator. At least one aperture is defined by the lid. The aperture enables the non-curing thermal conductive liquid coolant to be dispensed within the volume. A stopper is used to seal the aperture.

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

BRIEF DESCRIPTION OF THE DRAWINGS

Non-limiting and non-exhaustive examples are described with reference to the following Figures.

DETAILED DESCRIPTION

Figure 1:
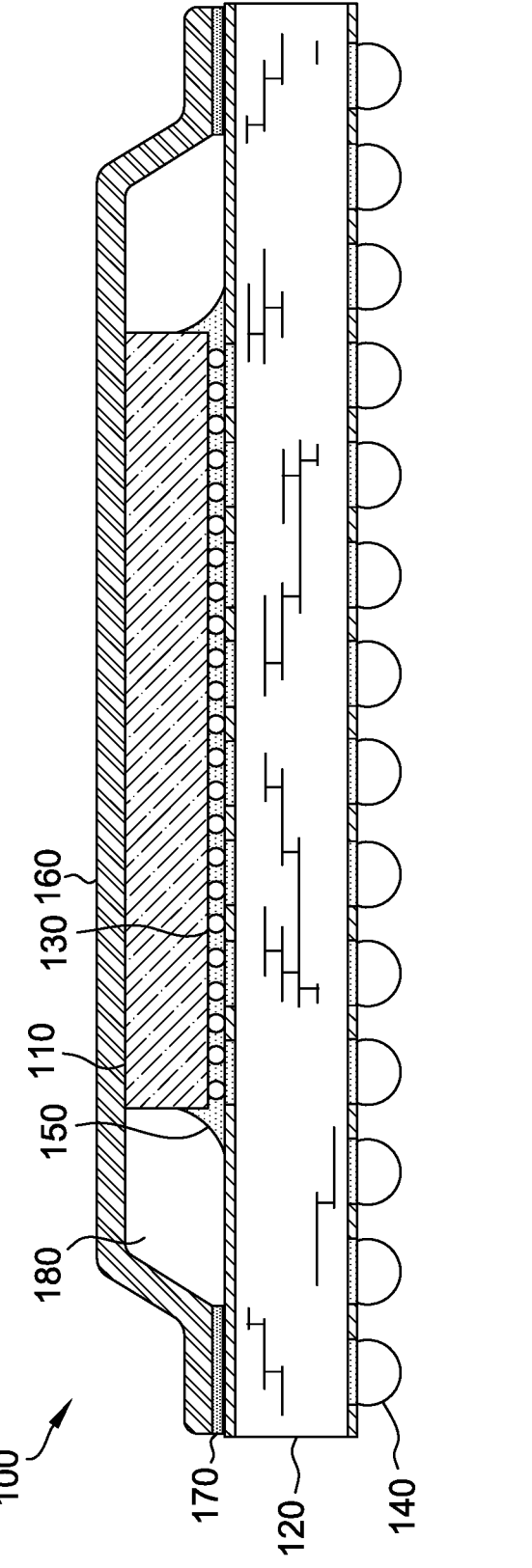
FIG. 1 illustrates a semiconductor chip according to an example.

In the following detailed description, references are made to the accompanying drawings that form a part hereof, and in which are shown by way of illustrations specific embodiments or examples. These aspects may be combined, other aspects may be utilized, and structural changes may be made without departing from the present disclosure. The following detailed description is therefore not to be taken in a limiting sense, and the scope of the present disclosure is defined by the appended claims and their equivalents.

As indicated above, an increasing number of electronic devices use various semiconductor chips to process and/or store data. In addition to the increased demand, there is also a demand for semiconductor chips to have higher density, smaller size and higher performance. In order to address all of these demands, the form factor of various semiconductor chips is becoming smaller and thinner. Additionally, semiconductor chips are being fabricated to include high power components. These high-power components may include, but are not limited to, microprocessor devices, graphics processor units (GPUs), logic devices, application specific integrated circuits (ASICs), field programmable gate arrays (FPGAs), and/or high-power dies. During operation, each of these components may generate an amount of heat that is detrimental to the operation of the semiconductor chips. For example, if heat is not sufficiently dissipated from the semiconductor chips, the heat may cause performance and/ or reliability issues.

In order to address the above, the present disclosure describes various thermal dissipation features for semiconductor chips and in particular, semiconductor chips with lidded structures. The thermal dissipation features described herein may effectively and efficiently dissipate heat from the semiconductor chips without increasing the overall size of the semiconductor chips or sacrificing the performance of the semiconductor chips.

In the examples described herein, a semiconductor chip may also be referred to as a semiconductor package. The semiconductor chip may be a system in a package (SiP). In another example, the semiconductor chip may be a high-performance flip chip ball grid array (FC-BGA) structure. For example, the semiconductor chip may include a flip chip die electrically coupled to a substrate. The semiconductor chip may include multiple components such as for example, a data storage structure (e.g., NAND die stack) and a controller or other processing circuitry. The semiconductor chip may also include a lid. The lid may be coupled to the substrate and enclose the flip chip die and/or the various structures that are coupled to the substrate.

In an example, the lid is made of metal or some other thermal conductive material and may act as a heat sink. For example, a bottom surface of the lid may contact a top surface of the flip chip die in order to dissipate heat (e.g., to another structure and/or to a surrounding environment).

However, in conventional FC-BGA structures, the lid may also define a volume that is either filled with a molding material (e.g., an epoxy molding compound) or with air and/or gas that has been trapped under the lid. The molding material may act as a thermal insulator and the air and/or gas has low thermal conductivity properties.

In order to address the above, the semiconductor chip described herein includes a thermal conductive liquid coolant that is inserted into the volume defined by the lid. The thermal conductive liquid coolant is comprised of non-curing or non-curable materials and/or liquids. As such, the thermal conductive liquid coolant will remain as a liquid throughout the life of the semiconductor chip.

In an example, the thermal conductive liquid coolant includes thermal conductive particles (e.g., nanoparticles or nanometer-sized particles) that are suspended in the thermal conductive liquid coolant. In addition, the semiconductor chip may include one or more micro-rotators that, when actuated, cause the thermal conductive liquid coolant to cylindrically flow or otherwise move within the volume defined by the lid and enhance the thermal convection properties of the thermal conductive liquid coolant.

In accordance with the above, many technical benefits may be realized including, but not limited to, better/higher thermal dissipation properties of semiconductor packages when compared to current solutions; lower operating temperatures of semiconductor packages without negatively impacting the performance of the semiconductor packages; and maintaining or decreasing the size/dimensions of semiconductor packages while improving the thermal dissipation properties of semiconductor packages.

These and other examples will be explained in greater detail below with respect to FIG. 1-FIG. 6.

FIG. 1 illustrates an example of a semiconductor chip 100 according to an example. In the example shown in FIG. 1, the semiconductor chip 100 includes a flip chip die 110. The flip chip die 110 may be a high power flip chip die 110 that generates a significant amount of heat. For example, the flip chip die 110 may be an integrated circuit (e.g., controller, GPU, ASIC), a die stack (e.g., a NAND die stack), or some other electrical component. Although a flip chip die 110 is specifically mentioned, other circuits, chips and/or associated connections may be used.

The flip chip die 110 may be mounted on a substrate 120. In an example, the substrate 120 is a high density interconnection (HDI) substrate that includes a number of copper-filled vias that enable components coupled to a top surface of the substrate 120 to be electrically and/or communicatively coupled to one or more components or connection/ coupling mechanisms disposed on a bottom surface of the substrate 120.

For example, the flip chip die 110 may be mounted on the top surface of the substrate 120 by one or more solder bumps and/or associated copper pillars 130. Various copper filled vias may electrically and/or communicatively couple the flip chip die 110 (and/or the solder balls and/or copper pillars 130) to various solder balls 140 or other conductive elements provided on a bottom surface of the substrate 120. The solder balls 140 may be arranged in an array and enable the semiconductor chip 100 to be electrically and/or communicatively coupled to another component, such as, for example, a device package, a circuit board and the like.

The semiconductor chip 100 may also include an underfill 150. The underfill 150 may be a dielectric material and may be used to further secure the flip chip die 110 to the substrate 120.

The semiconductor chip 100 may also include a lid 160. In an example, the lid 160 is comprised of a thermal conductive material (e.g., metal). The lid 160 covers the flip chip die 110. The lid 160 is coupled or otherwise secured to the substrate 120 using an adhesive or an adhesive layer 170 (e.g., glue, epoxy or other adhesive). The adhesive layer 170 forms a seal between the lid 160 and the substrate 120.

In an example, the semiconductor chip 100 may also include a thermal interface material (TIM). The thermal interface material may be in the form of a layer that is disposed within the lid 160, disposed on a bottom surface of the lid 160 and/or disposed on a top surface of the flip chip die 110. The thermal interface layer may enhance heat transfer from the flip chip die 110 to the lid 160.

As mentioned above, during a fabrication process in which the lid 160 is mounted or otherwise coupled to the substrate 120, air and/or gas may be trapped or otherwise contained in a volume 180 defined by the lid 160. Additionally, due to manufacturing tolerances, the lid 160 may not fully contact the top surface of the flip chip die 110. Any air pockets within the volume 180 and/or between the lid 160 and the flip chip die 110 may restrict heat transfer from the flip chip die 110 to the lid 160.

Figures 2A, 2B:
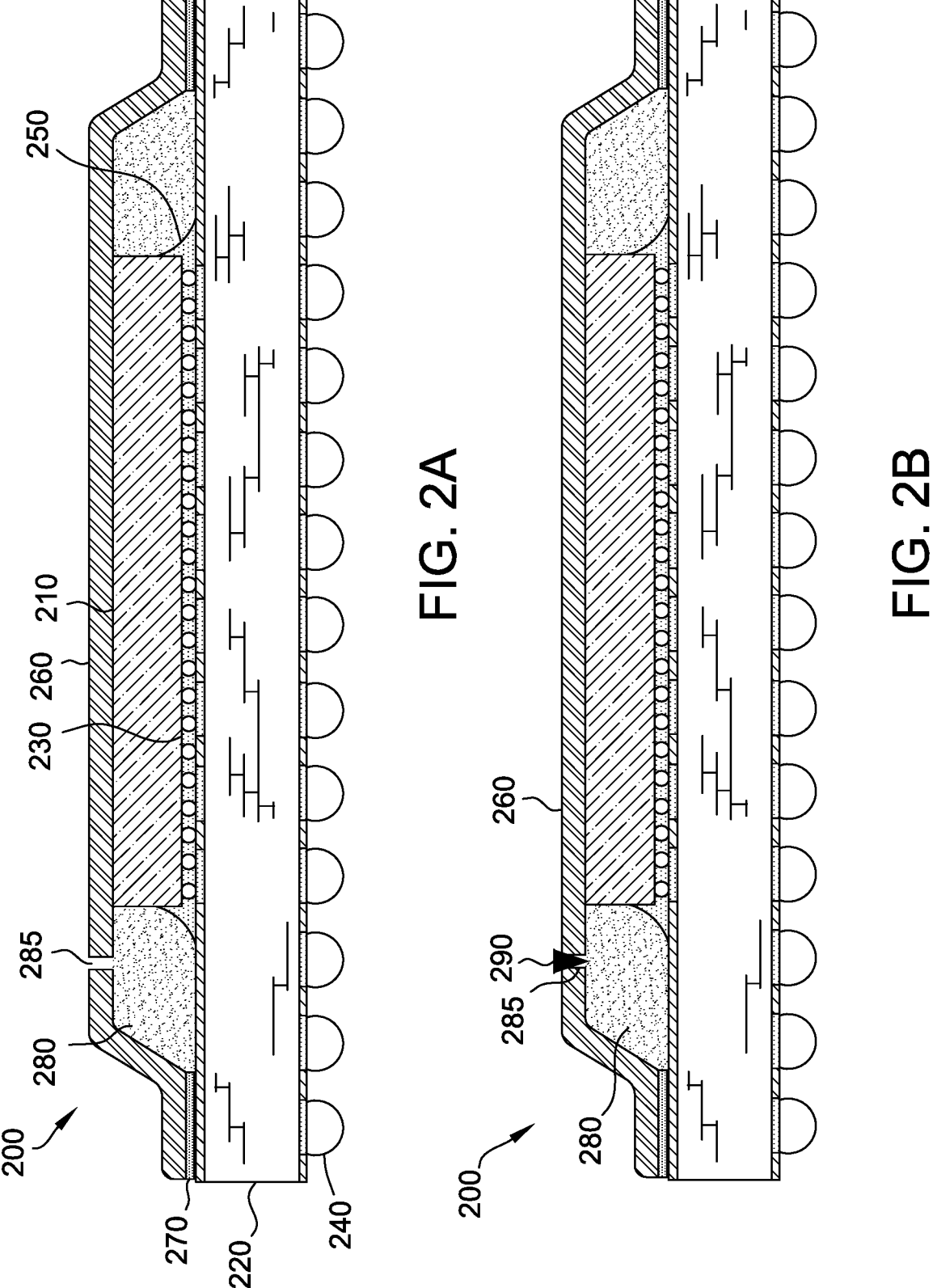
FIG. 2A illustrates a semiconductor chip having a thermal conductive liquid coolant as a thermal dissipation feature according to an example.
FIG. 2B illustrates the semiconductor chip of FIG. 2A in which a stopper is used to fill an aperture defined by a lid of the semiconductor chip according to an example.

FIG. 2A illustrates a semiconductor chip 200 having a thermal conductive liquid coolant 280 as a thermal dissipation feature according to an example. In an example, the semiconductor chip 200 may be similar to (or have similar components as) the semiconductor chip 100 shown and described with respect to FIG. 1.

For example, the semiconductor chip 200 includes a flip chip die 210 mounted to a substrate 220. The flip chip die 210 may be a high power flip chip die such as previously described. Likewise, the substrate 220 may be a high density interconnection (HDI) substrate that includes a number of copper-filled vias that enables the flip chip die 210 to be electrically and/or communicatively coupled to one or more components or connection/coupling mechanisms (e.g., solder balls 240) disposed on a bottom surface of the substrate 220. Although a single flip chip die 210 is illustrated, a number of flip chip dies or a number of different components may be mounted on the substrate 220.

In an example, the flip chip die 210 is coupled, fabricated or otherwise mounted on the top surface of the substrate 220 by one or more solder bumps and/or associated copper pillars 230. The solder bumps and/or copper pillars 230 may be electrically and/or communicatively coupled to the solder balls 240. The semiconductor chip 200 may also include an underfill 250. The underfill 250 may be used to further secure the flip chip die 210 to the substrate 220 and/or provide environmental protection to the flip chip die 210.

The semiconductor chip 200 also includes a lid 260. The lid 260 may be comprised of a thermal conductive material (e.g., metal). The lid 260 covers the flip chip die 210 and may be coupled or otherwise secured to the substrate 220 using an adhesive or an adhesive layer 270. The adhesive layer 270 forms a seal between the lid 260 and the substrate 220. In an example, an inner surface of the lid 260 is secured to a top surface of the flip chip die 210 or other integrated circuit. The inner surface of the lid may be secured to the top surface of the flip chip die 210 using a thermal interface material.

The semiconductor chip 200 may also include a thermal interface layer comprised of a thermal interface material (TIM) or a liquid thermal interface material (LTIM). The thermal interface layer may be disposed within the lid 260, on a bottom surface of the lid 260 and/or on a top surface of the flip chip die 210. As explained previously, the thermal interface layer may enhance heat transfer from the flip chip die 210 to the lid 260.

In the example shown in FIG. 2A, the lid 260 defines an opening or aperture 285. Although a single aperture 285 is shown on a top surface of the lid 260, the lid 260 may define a number of different apertures 285 disposed at various locations on the lid 260. For example, one or more apertures 285 may be disposed on a sidewall of the lid 260.

In an example, each aperture 285 enables a thermal conductive liquid coolant 280 to be inserted into a volume (e.g., volume 180 (FIG. 1)) defined by the lid 260. The thermal conductive liquid coolant 280 displaces any air and/or gas that may be trapped or otherwise contained in the volume 180 defined by the lid 260 during a fabrication process.

For example, the lid 260 may define multiple different apertures 285. One aperture 285 may be used as an inlet for the thermal conductive liquid coolant 280 and one aperture 285 may be used as an outlet for any air and/or gas that is trapped by the lid 260. For example, the thermal conductive liquid coolant 280 may be inserted into a first aperture 280 and flow up and/or around the flip chip die 210 to fill or substantially fill the volume 180 defined by the lid 260. Any air and/or gas that may be present in the volume 180 will be displaced by the thermal conductive liquid coolant 280 and exit through the second aperture 285.

In addition to filling or substantially filling the volume 180 defined by the lid 260, the thermal conductive liquid coolant 280 may also fill or substantially fill any space or void that is present between the lid 260 and the flip chip die 210 (e.g., due to manufacturing tolerances and/or design choices).

The thermal conductive liquid coolant may be disposed or inserted underneath the lid 260 using a number of different processes or methods. For example, the thermal conductive liquid coolant 280 may be inserted or injected into the volume 180 by a pressure injection process. For example, the thermal conductive liquid coolant 280 may be contained in a pressurized dispenser or a pump. A nozzle, spout or other outlet mechanism of the pressurized dispenser or pump may be coupled onto and/or in the aperture 285 and be used to dispense the thermal conductive liquid coolant 280 into the volume 180. In another example, the thermal conductive liquid coolant 280 may be drawn into the volume 180 using a vacuum or other process.

In an example, the thermal conductive liquid coolant 280 is a non-curing substance, is comprised of non-curing liquids or materials or is otherwise non-curable. As such, the thermal conductive liquid coolant 280 will remain a liquid throughout the life of the semiconductor chip 200. In some examples, the thermal conductive liquid coolant 280 is a nontoxic liquid having thermo-physical properties, a long service life and a high flash point. In additional examples, the thermal conductive liquid coolant 280 has electrical conductivity properties. The thermal conductive liquid coolant may also have high thermal conductivity and specific heat, low viscosity, high latent heat of evaporation, a low freezing point and/or burst point, a high atmospheric boiling point, a narrow desired boiling point, good chemical and thermal stability, and/or comprised of non-corrosive materials.

In an example, the thermal conductive liquid coolant 280 consists of dielectric liquid coolants and/or non-dielectric liquid coolants. Example dielectric liquid coolants include, but are not limited to, silicate-ester, aliphatics, silicones, fluorocarbons, etc. Example non-dielectric liquid coolants include, but are not limited to, ethylene glycol, propylene glycol, methanol/water, ethanol/water and the like. In yet another example, the thermal conductive liquid coolant consists of one or more of the following: deionized water, water with an additive, mineral oil, fluorocarbon oil, transformer oil, silicone oil, Freon and/or Fluorinert. It is also contemplated that the thermal conductive liquid coolant 280 may be customizable based, at least in part, on the size of the semiconductor chip 200, the capabilities of the semiconductor chip 200, the number and/or type of components/circuits coupled to the substrate, and/or the intended use of the semiconductor chip 200.

The thermal conductive liquid coolant 280 may be a nanofluid. For example, the thermal conductive liquid coolant 280 may include nanoparticles or nanometer-sized particles that are suspended in the thermal conductive liquid coolant 280. These nanoparticles further enhance the thermal dissipation properties of the thermal conductive liquid coolant 280. For example and referring to FIG. 3, nanoparticles 300 may be contained in and/or suspended within the thermal conductive liquid coolant 280. The nanoparticles may be comprised of a metal or other thermal conductive material including, but not limited to, aluminum, copper, silver, magnesium, gold, silicon carbide, zinc, graphite or a combination thereof. In an example, nanoparticles may be stabilized by absorbing a dispersant layer around a surface of the nanoparticle.

FIG. 2B illustrates the semiconductor chip 200 of FIG. 2A in which a stopper 290 is used to fill the aperture 285 defined by the lid 260 of the semiconductor chip 200 according to an example. For example, when a volume (e.g., a volume 180 (FIG. 1)) defined by the lid 260 has been filled or substantially filled by the thermal conductive liquid coolant 280, and/or any/all/substantially all air and/or gas has been removed from the volume 180, the aperture 285 is sealed or otherwise closed by a stopper 290. The stopper 290 may be a plug or other mechanism that closes or otherwise seals the aperture 285. In one example, the stopper 290 is a rubber stopper that may be inserted into and/or removed from the aperture 285.

In another example, the stopper 290 is a dielectric material that may be solidified by a curing process or other process that causes the dielectric material to harden. In an example, the stopper may be an epoxy, a resin, a ceramic, a solder material and the like. In yet another example, the stopper 290 may be comprised of a thermal conductive material (e.g., silver paste, copper paste) that may subsequently harden and provide a seal. Regardless of the material used, the stopper 290 seals or substantially seals each aperture 285 to ensure that the thermal conductive liquid coolant 280 cannot exit the aperture 285 while also preventing any contaminants from entering the aperture 285.

In an example, a top portion of the stopper 290 is inserted into the aperture 285 such that the stopper 290 is flush or substantially flush with a top surface of the lid 260. In examples in which the top portion of the stopper 290 is not flush or substantially flush with the top surface of the lid 260, a material removal process (e.g., a grinding process, an etching process) may be used to remove an exposed portion of the stopper 290. As such, the combination of the stopper 290 and the top surface of the lid 260 will remain planar or substantially planar.

Figures 3, 4:
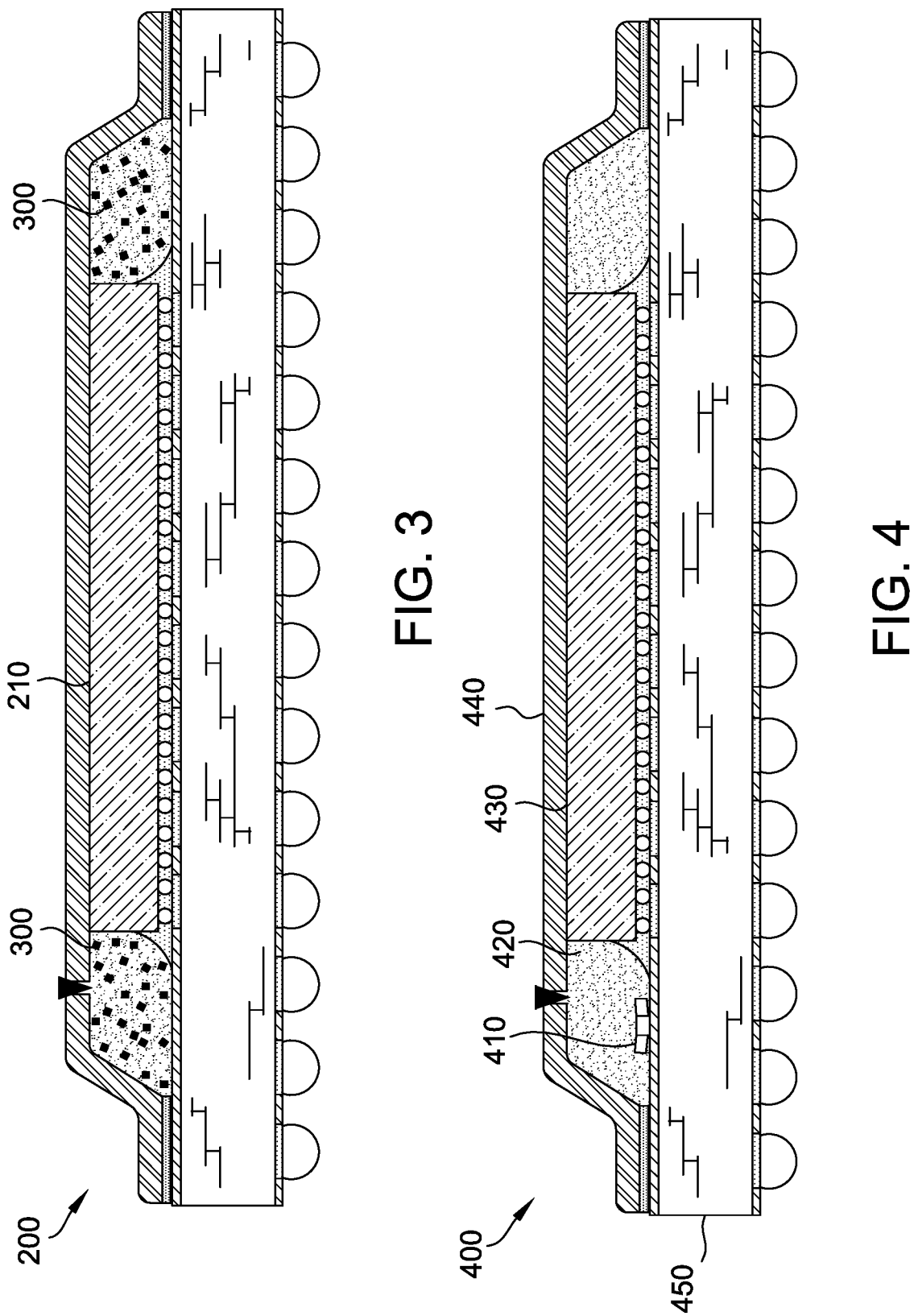
FIG. 3 illustrates a semiconductor chip having various nanometer-sized particles suspended in a thermal conductive liquid coolant according to an example.
FIG. 4 illustrates a semiconductor chip having a micro-rotator disposed within a thermal conductive liquid coolant according to an example.

FIG. 4 illustrates a semiconductor chip 400 having a micro-rotator 410 disposed within a thermal conductive liquid coolant 420 according to an example. In an example, the semiconductor chip 400 is similar to the semiconductor chip 200 shown and described with respect to FIG. 2A-FIG. 3. However, in addition to the various components and features described above with respect to FIG. 2A-FIG. 3, the semiconductor chip 400 includes a micro-rotator 410 that, when activated, agitates the liquid and/or causes the thermal conductive liquid coolant 420 to flow (e.g., cyclically flow) near, at and/or around a flip chip die 430 of the semiconductor chip 400.

In an example, the micro-rotator 410 is activated or otherwise controlled by the flip chip die 430. In another example, the micro-rotator 410 is activated or controlled by a controller, a processor and/or another semiconductor chip. The micro-rotator 410 may be activated in response to a determined or detected condition. For example, the micro-rotator 410 may be activated in response to a temperature of the flip chip die 430 or the semiconductor chip 400 meeting or exceeding a temperature threshold (e.g., 125 degrees Celsius).

For example, the semiconductor chip 400 may include or otherwise be associated with a sensor (e.g., a temperature sensor) that measures an operating temperature of the flip chip die 430 and/or the semiconductor chip 400. If the sensor indicates that the temperature threshold is met or exceeded, the flip chip die 430 (or an associated controller/processor) may cause the micro-rotator 410 to be activated.

Once activated, the micro-rotator 410 may partially or fully rotate about its axis, thereby causing the thermal conductive liquid coolant 420 to move. Movement of the thermal conductive liquid coolant 420 enhances the thermal convection characteristics/capabilities of the semiconductor chip 400. The micro-rotator 410 may continue to circulate or move the thermal conductive liquid coolant 420 until the temperature reading indicates the operating temperature of the flip chip die 430 (or the semiconductor chip 400) falls below the temperature threshold.

In some cases, and due to the design of the flip chip die 410 and/or the function of the flip chip die 410, an uneven temperature distribution may be present in the semiconductor chip 400. As such, the micro-rotator 410 may be used to even out the temperature distribution. For example, as the micro-rotator 410 rotates about its axis and causes the thermal conductive liquid coolant 420 to move within a volume (e.g., volume 180 (FIG. 1)) defined by a lid 440, the thermal conductive liquid coolant 420 balances any temperature gaps and causes heat to be conducted through, and out of, the lid 440 and/or a substrate 450 of the semiconductor chip 400.

Figure 5:
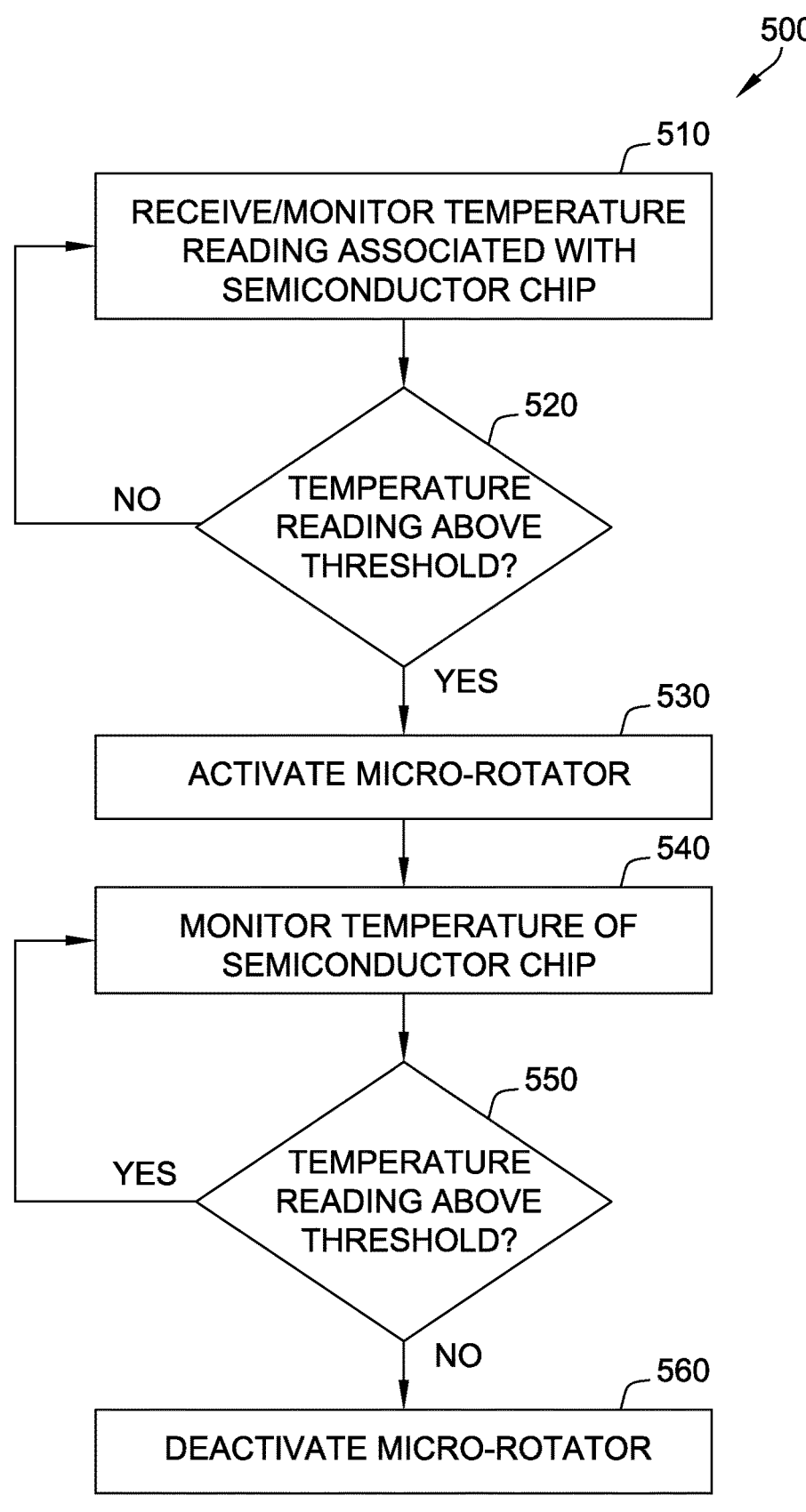
FIG. 5 illustrates a method for activating a micro-rotator associated with a semiconductor chip according to an example.

FIG. 5 illustrates a method 500 for activating a micro-rotator associated with a semiconductor chip according to an example. The method 500 may be performed by a semiconductor chip, such as, for example, the semiconductor chip 400 shown and described with respect to FIG. 4. In another example, the method 500 may be performed by a processing unit or controller associated with the semiconductor chip.

Method 500 begins when a controller or processing unit receives (510) a temperature reading associated with a semiconductor chip. In an example, the temperature reading may be received from a sensor that is disposed at or near a flip chip die associated with the semiconductor chip. The temperature reading may be received continuously, substantially continuously, periodically, in response to a request, and/or in response to a trigger condition (e.g., an amount of time the semiconductor chip has been active).

When the temperature reading is received, a determination (520) is made as to whether the temperature reading is above a temperature threshold. In an example, the temperature threshold is approximately 125 degrees Celsius, although other temperature thresholds may be used. If the temperature reading is not above the temperature threshold, the method 500 returns to operation 510 and the temperature of the semiconductor chip is continuously or periodically monitored.

However, if it is determined (520) that the temperature reading is above the temperature threshold, the controller or processing unit activates (530) the micro-rotator. As indicated previously, the micro-rotator (or multiple micro-rotators) may be disposed within a thermal conductive liquid coolant. Activation of the micro-rotator causes the thermal conductive liquid coolant to move within the volume and/or on/around the flip chip die. Movement of the thermal conductive liquid coolant increases the thermal dissipation capabilities of the thermal conductive liquid coolant.

While the micro-rotator is activated, the controller may continuously or periodically monitor (540) the temperature of the semiconductor chip to determine (550) whether the temperature of the semiconductor chip is above the temperature threshold. If the temperature reading is above the temperature threshold, the controller will continue to monitor (540) the temperature and the micro-rotator will be active.

However, when it is determined (550) that the temperature reading is below the threshold, the controller may deactivate (560) the micro-rotator. In an example, the controller may determine to deactivate the micro-rotator when the temperature reading is below the temperature threshold for a determined period of time (e.g., five seconds) and/or when the temperature reading is below the temperature threshold a predetermined number of degrees (e.g., five degrees).

Figure 6:
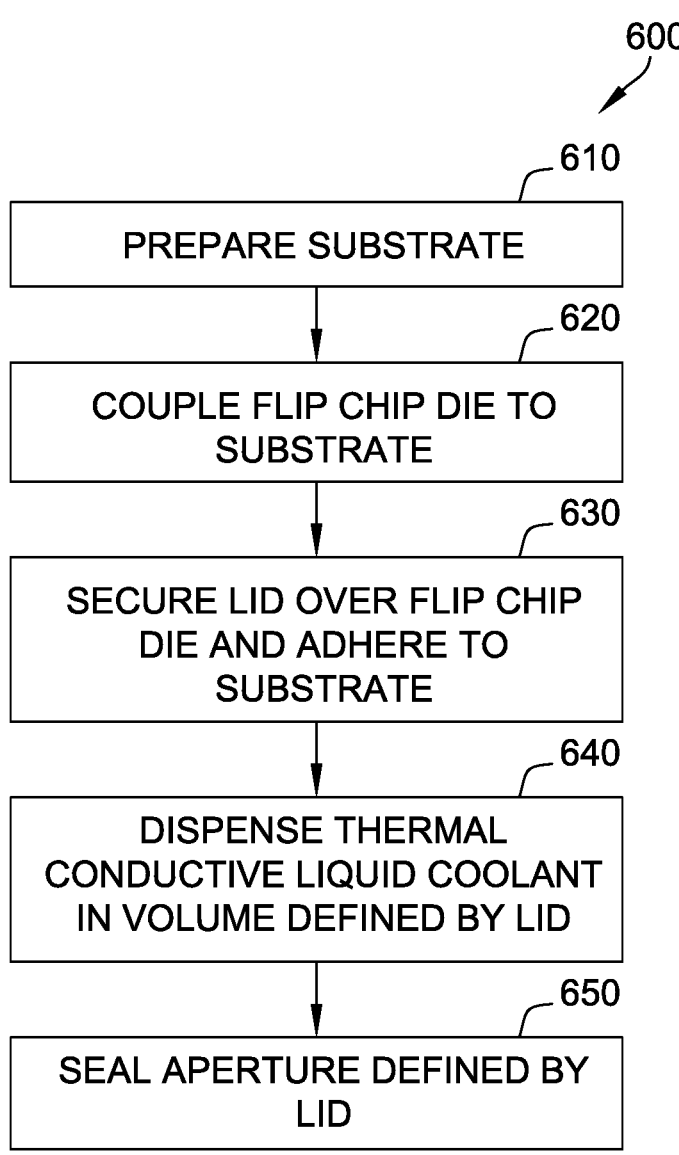
FIG. 6 illustrates a method for fabricating a semiconductor chip according to an example.

FIG. 6 illustrates a method 600 for fabricating a semiconductor chip according to an example. The method 600 may be used to fabricate the semiconductor chip 200 and/or the semiconductor chip 400 shown and described with respect to FIG. 2A-FIG. 4.

The method 600 begins when a substrate is prepared (610). In an example, the substrate is a high thermal substrate and may be comprised of multiple layers. As part of the preparation process, the substrate may be prepared/readied to have a flip chip die, an integrated circuit, a memory die stack or a combination thereof, electrically and/or communicatively coupled to a surface of the substrate.

Once the substrate has been prepared, the flip chip die is electrically and/or communicatively coupled (620) to the substrate. In an example, the flip chip die may be communicatively and/or electrically coupled to the substrate via one or more solder bumps and/or copper pillars. An underfill may also be used to further secure the flip chip die to the substrate. In addition to communicatively and/or coupling the flip chip die to the substrate, when a micro-rotator is used, the micro-rotator may also be moveably coupled to the substrate during this operation or the previous operation. When the micro-rotator is coupled to the substrate, the micro-rotator is coupled to the substrate such that power and/or instructions may be communicated or otherwise provided to the micro-rotator.

A lid or lidded structure may be secured (630) over the flip chip die. The lid may be secured to the substrate using an adhesive layer or other material. The adhesive layer creates a seal between the lid and the substrate such that contaminants cannot enter the semiconductor chip. The lid also defines a volume. The volume may consist of space between the lid, the substrate and the flip chip die.

The lid may also define one or more apertures. Each of the one or more apertures may be provided at various locations on the lid. In an example, the apertures are formed in the lid prior to the lid being secured to the substrate. In another example, the apertures may be formed in the lid after having been secured to the substrate.

When the lid has been coupled to the substrate, a thermal conductive liquid coolant is dispensed into the volume defined by the lid. As previously described, the thermal conductive liquid coolant is a non-curing liquid that may include nanometer-sized particles (also referred to as nanoparticles). The thermal conductive liquid coolant displaces any air and/or gas that may be trapped under the lid. The non-curing thermal conductive liquid coolant may flow around the flip chip die and/or the other components disposed underneath the lid and fill or substantially fill the volume.

When the thermal conductive liquid coolant has filled or substantially filled the volume defined by the lid, the one or more apertures defined by the lid are closed and/or sealed (650). In an example, the one or more apertures are sealed by a plug, a stopper or other mechanism that can close or otherwise seal the one or more apertures. For example, the stopper may be a rubber stopper. In another example, the stopper is a dielectric material that may be solidified by a curing process or other process that causes the dielectric material to harden. In yet another example, the stopper may be an epoxy, a resin, a ceramic, a solder material, a thermal conductive material/paste and the like.

A top portion of the stopper may be flush or substantially flush with a top surface of the lid. In examples in which the top portion of the stopper is not flush or substantially flush with the top surface of the lid, a material removal process may be used to remove an exposed portion of the stopper.

Although the examples described herein are shown and described with respect to a semiconductor chip having a flip chip die, the features described herein may be applied to any type of lidded semiconductor products.

In accordance with the above, examples of the present application describe a semiconductor chip, comprising: a substrate; an integrated circuit electrically coupled to a surface of the substrate; a lid enclosing the integrated circuit and coupled to the substrate, the lid defining a volume between the substrate and the lid; a non-curing thermal conductive liquid coolant at least substantially filling the volume; at least one aperture defined by the lid, the aperture enabling the non-curing thermal conductive liquid coolant to be dispensed within the volume; and a stopper sealing the aperture. In an example, the semiconductor chip also includes a micro-rotator coupled to the substrate and operative to cause the non-curing thermal conductive liquid coolant to cyclically flow within the volume. In an example, the micro-rotator is activated in response to a temperature reading associated with the semiconductor chip exceeding a temperature threshold. In an example, the micro-rotator is deactivated in response to the temperature reading associated with the semiconductor chip falling below the temperature threshold. In an example, the non-curing thermal conductive liquid coolant comprises a plurality of particles suspended within the non-curing thermal conductive liquid coolant. In an example, the particles comprise a thermal conductive material. In an example, the non-curing thermal conductive liquid coolant is comprised of one or more of: deionized water; water with an additive; mineral oil; fluorocarbon oil; transformer oil; silicone oil; Freon; and Fluorinert.

Another example describes a semiconductor chip, comprising: a substrate; integrated circuit means electrically coupled to a surface of the substrate; an enclosure means coupled to the substrate and substantially enclosing the integrated circuit means, the enclosure means defining a space between the substrate and a bottom surface of the enclosure means; and a non-curing liquid coolant means at least substantially filling the space defined by the enclosure means, the non-curing liquid coolant means comprising a plurality of nanoparticles. In an example, the enclosure means defines an opening and wherein the opening enables the non-curing liquid coolant means to be dispensed within the space. In an example, the semiconductor chip also includes a sealing means for sealing the opening defined by the enclosure means. In an example, the semiconductor chip also includes a rotator means coupled to the substrate and operative to cause non-curing liquid coolant means to flow within the space. In an example, the rotator means is activated in response to a temperature reading associated with the semiconductor chip exceeding a temperature threshold. In an example, the rotator means is deactivated in response to the temperature reading associated with the semiconductor chip falling below the temperature threshold. In an example, the nanoparticles comprise a thermal conductive material. In an example, the non-curing liquid coolant means is comprised of one or more of: deionized water; water with an additive; mineral oil; fluorocarbon oil; transformer oil; silicone oil; Freon; and Fluorinert.

Examples of the present application also describe a semiconductor chip, comprising: a high-density interconnection substrate; an integrated circuit electrically coupled to a surface of the high-density interconnection substrate; a micro-rotator electrically coupled to the high-density interconnection substrate; a lid coupled to the substrate, the lid enclosing the integrated circuit and the micro-rotator and defining a volume; a non-curing thermal conductive liquid coolant at least substantially filling the volume and adapted to flow within the volume upon activation of the micro-rotator; at least one aperture defined by the lid, the aperture enabling the non-curing thermal conductive liquid coolant to be dispensed within the volume; and a stopper sealing the aperture. In an example, the micro-rotator is activated in response to a temperature reading associated with the semiconductor chip exceeding a temperature threshold. In an example, the non-curing thermal conductive liquid coolant comprises a plurality of particles suspended within the non-curing thermal conductive liquid coolant, wherein the particles comprise a thermal conductive material. In an example, the non-curing thermal conductive liquid coolant is comprised of one or more of: deionized water; water with an additive; mineral oil; fluorocarbon oil; transformer oil; silicone oil; Freon; and Fluorinert. In an example, an inner surface of the lid is secured to a top surface of the integrated circuit with a thermal interface material.

The description and illustration of one or more aspects provided in the present disclosure are not intended to limit or restrict the scope of the disclosure in any way. The aspects, examples, and details provided in this disclosure are considered sufficient to convey possession and enable others to make and use the best mode of claimed disclosure.

The claimed disclosure should not be construed as being limited to any aspect, example, or detail provided in this disclosure. Regardless of whether shown and described in combination or separately, the various features (both structural and methodological) are intended to be selectively rearranged, included or omitted to produce an embodiment with a particular set of features. Having been provided with the description and illustration of the present application, one skilled in the art may envision variations, modifications, and alternate aspects falling within the spirit of the broader aspects of the general inventive concept embodied in this application that do not depart from the broader scope of the claimed disclosure.

References to an element herein using a designation such as "first," "second," and so forth does not generally limit the quantity or order of those elements. Rather, these designations may be used as a method of distinguishing between two or more elements or instances of an element. Thus, reference to first and second elements does not mean that only two elements may be used or that the first element precedes the second element. Additionally, unless otherwise stated, a set of elements may include one or more elements.

Terminology in the form of "at least one of A, B, or C" or "A, B, C, or any combination thereof" used in the description or the claims means "A or B or C or any combination of these elements." For example, this terminology may include A, or B, or C, or A and B, or A and C, or A and B and C, or 2A, or 2B, or 2C, or 2A and B, and so on. As an additional example, "at least one of: A, B, or C" is intended to cover A, B, C, A-B, A-C, B-C, and A-B-C, as well as multiples of the same members. Likewise, "at least one of: A, B, and C" is intended to cover A, B, C, A-B, A-C, B-C, and A-B-C, as well as multiples of the same members.

Similarly, as used herein, a phrase referring to a list of items linked with "and/or" refers to any combination of the items. As an example, "A and/or B" is intended to cover A alone, B alone, or A and B together. As another example, "A, B and/or C" is intended to cover A alone, B alone, C alone, A and B together, A and C together, B and C together, or A, B, and C together.

What is claimed is:

1. A semiconductor chip, comprising:
a substrate;
an integrated circuit electrically coupled to a surface of the substrate;
a lid enclosing the integrated circuit and defining a volume between the substrate and the lid;
a thermal interface material that is at least partially bonded to a top surface of the integrated circuit and a bottom surface of the lid;
a non-curing thermal conductive liquid coolant at least partially filling the volume;
at least one aperture defined by the lid, the aperture enabling the non-curing thermal conductive liquid coolant to be dispensed within the volume; and
a stopper sealing the aperture.

2. The semiconductor chip of claim 1, further comprising a micro-rotator coupled to the substrate and operative to cause the non-curing thermal conductive liquid coolant to cyclically flow within the volume.

3. The semiconductor chip of claim 2, wherein the micro-rotator is activated in response to a temperature reading associated with the semiconductor chip exceeding a temperature threshold.

4. The semiconductor chip of claim 3, wherein the micro-rotator is deactivated in response to the temperature reading associated with the semiconductor chip falling below the temperature threshold.

5. The semiconductor chip of claim 1, wherein the non-curing thermal conductive liquid coolant comprises a plurality of particles suspended within the non-curing thermal conductive liquid coolant.

6. The semiconductor chip of claim 5, wherein the particles comprise a thermal conductive material.

7. The semiconductor chip of claim 1, wherein the non-curing thermal conductive liquid coolant is comprised of one or more of:
deionized water;
water with an additive;
mineral oil;
fluorocarbon oil;
transformer oil;
silicone oil;
Freon; and
Fluorinert.

8. A semiconductor chip, comprising:
a substrate;
integrated circuit means electrically coupled to a surface of the substrate;
an enclosure means coupled to the substrate and substantially enclosing the integrated circuit means, the enclosure means defining a space between the substrate and a bottom surface of the enclosure means;
a thermal conductive means associated with the enclosure means and coupled to a surface of the integrated circuit means; and
a non-curing liquid coolant means at least partially filling the space defined by the enclosure means, the non-curing liquid coolant means comprising a plurality of nanoparticles.

9. The semiconductor chip of claim 8, wherein the enclosure means defines an opening and wherein the opening enables the non-curing liquid coolant means to be dispensed within the space.

10. The semiconductor chip of claim 9, further comprising a sealing means for sealing the opening defined by the enclosure means.

11. The semiconductor chip of claim 8, further comprising a rotator means coupled to the substrate and operative to cause the non-curing liquid coolant means to flow within the space.

12. The semiconductor chip of claim 11, wherein the rotator means is activated in response to a temperature reading associated with the semiconductor chip exceeding a temperature threshold.

13. The semiconductor chip of claim 12, wherein the rotator means is deactivated in response to the temperature reading associated with the semiconductor chip falling below the temperature threshold.

14. The semiconductor chip of claim 8, wherein the nanoparticles comprise a thermal conductive material.

15. The semiconductor chip of claim 8, wherein the non-curing liquid coolant means is comprised of one or more of:

deionized water;

water with an additive;

mineral oil;

fluorocarbon oil;

transformer oil;

silicone oil;

Freon; and

Fluorinert.

16. A semiconductor chip, comprising:

a high-density interconnection substrate;

an integrated circuit electrically coupled to a surface of the high-density interconnection substrate;

a micro-rotator electrically coupled to the high-density interconnection substrate;

a lid coupled to the high-density interconnection substrate, the lid enclosing the integrated circuit and the micro-rotator and defining a volume;

a non-curing thermal conductive liquid coolant at least partially filling the volume and adapted to flow within the volume upon activation of the micro-rotator;

an aperture defined by the lid, the aperture enabling the non-curing thermal conductive liquid coolant to be dispensed within the volume; and a stopper sealing the aperture.

17. The semiconductor chip of claim 16, wherein the micro-rotator is activated in response to a temperature reading associated with the semiconductor chip exceeding a temperature threshold.

18. The semiconductor chip of claim 16, wherein the non-curing thermal conductive liquid coolant comprises a plurality of particles suspended within the non-curing thermal conductive liquid coolant, wherein the particles comprise a thermal conductive material.

19. The semiconductor chip of claim 16, wherein the non-curing thermal conductive liquid coolant is comprised of one or more of:

deionized water;

water with an additive;

mineral oil;

fluorocarbon oil;

transformer oil;

silicone oil;

Freon; and

Fluorinert.

20. The semiconductor chip of claim 16, wherein an inner surface of the lid is secured to a top surface of the integrated circuit with a thermal interface material.

* * * * *